US010124365B2

(12) United States Patent
Hoedl et al.

(10) Patent No.: US 10,124,365 B2
(45) Date of Patent: Nov. 13, 2018

(54) METHOD AND DEVICE FOR METERING A COATING LIQUID IN A PROCESSING MACHINE

(75) Inventors: Otto Hoedl, Rodgau (DE); Guenter Jung, Mossautal (DE); Jann Neumann, Darmstadt (DE); Edgar Doersam, Obertshausen (DE)

(73) Assignee: INDUSTRIE-AUTOMATION VERTRIEBS-GMBH, Rodgau (DE)

( * ) Notice: Subject to any disclaimer, the term of this patent is extended or adjusted under 35 U.S.C. 154(b) by 1829 days.

(21) Appl. No.: 12/115,277

(22) Filed: May 5, 2008

(65) Prior Publication Data

US 2008/0274267 A1 Nov. 6, 2008

(30) Foreign Application Priority Data

May 5, 2007 (DE) ........................ 10 2007 021 191

(51) Int. Cl.
*C23C 16/52* (2006.01)
*B05C 11/10* (2006.01)
(Continued)

(52) U.S. Cl.
CPC .......... *B05C 11/1002* (2013.01); *B05C 1/003* (2013.01); *B05C 1/0826* (2013.01); *B05D 1/28* (2013.01)

(58) Field of Classification Search
CPC .................................................. B05C 11/1002
(Continued)

(56) References Cited

U.S. PATENT DOCUMENTS 5,367,982 A * 11/1994 DeMoore et al. .............. 118/46
5,520,739 A 5/1996 Frazzitta
(Continued)

FOREIGN PATENT DOCUMENTS

DE 20012101 11/2000
DE 10152461 * 5/2002 ............. B41F 31/00
(Continued)

OTHER PUBLICATIONS

"Varianten der Inline-Lackierung", Glanzveredelungsverfahren / Inline, Koenig & Bauer AG, pp. 32-35.

*Primary Examiner* — Tabatha L Penny
(74) *Attorney, Agent, or Firm* — Leydig, Voit & Mayer, Ltd.

(57) ABSTRACT

A method is provided for metering a coating liquid in a processing machine having a metering device including at least one applicator roller and one counter-pressure cylinder that forms a coating nip and that guides the printing substrate, the metering device being operatively connected to a circulation system for circulating the coating liquid including a supply line, a return line, a reservoir and a conveying pump. The method includes the steps of: pre-selecting, on the main regulation device, a first target temperature value for the coating liquid in a first area defined by the circulation system downstream of the temperature-regulation unit and by the coating nip; conveying the coating liquid using the conveying pump in a direction of the coating nip; detecting a first actual temperature value of the coating liquid at the temperature-regulation unit using a first sensor; detecting a second actual temperature value of the coating liquid in the first area using a second sensor; transmitting at least one signal to the main regulation device for each of the first and second temperature values detected; comparing the second actual temperature value to the first target temperature value using the main regulation device; and sending at least one
(Continued)

control signal from the main regulation device as a function of the first detected actual temperature value.

15 Claims, 3 Drawing Sheets

(51) Int. Cl.
*B05C 1/00* (2006.01)
*B05C 1/08* (2006.01)
*B05D 1/28* (2006.01)

(58) Field of Classification Search
USPC ........................................... 427/8; 118/667
See application file for complete search history.

(56) References Cited

U.S. PATENT DOCUMENTS

| | | | | |
|---|---|---|---|---|
| 5,598,777 | A | 2/1997 | DeMoore et al. | |
| 6,379,463 | B1 * | 4/2002 | Kelley et al. | 118/666 |
| 2002/0112636 | A1 * | 8/2002 | Desaulniers et al. | 101/487 |

FOREIGN PATENT DOCUMENTS

| | | | | |
|---|---|---|---|---|
| DE | 10305918 | * | 10/2003 | B41F 23/08 |
| EP | 0612618 | | 8/1994 | |
| JP | 5138098 | A | 6/1993 | |
| JP | 9123393 | A | 5/1997 | |
| JP | 2001340794 | A | 12/2001 | |

* cited by examiner

METHOD AND DEVICE FOR METERING A COATING LIQUID IN A PROCESSING MACHINE

Priority is claimed to German Patent Application No. DE 10 2007 021 191.2, filed on May 5, 2007, the entire disclosure of which is incorporated by reference herein.

The present invention relates to a method and to a device for metering a coating liquid in a processing machine. The method as well as the device are particularly suitable for the coating of printing substrates with a coating liquid, especially in the form of printing ink or a coating composition, in printing or coating machines.

BACKGROUND

European patent application EP-A-0 612 618 describes a coating circulation and wash-up system for printing presses. Here, a metering device consists of a chambered doctor blade with an applicator roller that engages with a plate cylinder (rubber blanket cylinder). A supply line and a return line that are coupled to a reservoir for a coating liquid, for example, a coating composition, are associated with the metering device. The supply line and the return line have pumps upstream and downstream from the metering device, especially peristaltic pumps, that ensure the supply and return of the coating liquid. A first switch-over valve is installed in the supply line for the coating liquid and is also coupled on the line side to a reservoir to hold water that can be heated if necessary. A second switch-over valve is installed in the return line for the coating liquid and is also coupled on the line side to a reservoir to hold waste. The metering device can be switched over by means of valves, so that it can be supplied with either ink or water (for purposes of washing the device).

German utility model DE 200 12 101 U1 describes an ink supply and washing device for a printing machine. The device preferably comprises ink circulation pumps that pump the ink from ink reservoirs on the line side to the inking unit of the printing machine and back again. For special coating applications, the coating composition can be cooled or heated by means of a heat exchanger. Following the coating process, switch-over valves can be employed to flush and clean the coating circulation system with washing water (cleaning liquid). The components of the device are controlled, regulated and monitored centrally by a control module.

The publication titled KBA-Process, no. 3, edition January/2006, pages 32 to 35, describes variants of inline coating. According to this publication, a coating tower has two separate coating circulation systems that can be switched over between two types of coating compositions. Optionally, a fully automatic and self-cleaning coating supply system for dispersion coatings and UV coatings can be connected. Here, the coating composition in question is conveyed through an aggregate for conditioning it before it reaches the metering device, in this case a chambered doctor blade. Publisher: Koenig & Bauer AG, Marketing Department, Friedrich-Koenig-Str. 4, 97080 Würzburg, Germany; Internet address as of May 2, 2007: www.kba-print.de/de/news/presseservice/download_kba_process.html.

U.S. Pat. No. 5,520,739 describes an assembly for coating a surface in a printing process which, from a reservoir containing a single aqueous coating formulation, supplies a coating composition for various systems in order to feed the coating compositions to printing processes. The device for feeding the coating compositions is described as a reactor vessel in which the temperature and thus the viscosity of the coating composition can be influenced. For this purpose, the reactor vessel is provided with a heat exchanger, a temperature sensor as well as a viscometer to establish the predetermined viscosity of the coating composition. The composition can only be influenced shortly before the coating process. The physical conditions between the reactor vessel and the coating process are not taken into account.

SUMMARY OF THE INVENTION

An aspect of the present invention is to provide a method as well as a device of the above-mentioned type in such a way that it is ensured that the coating liquid is processed in a stable manner.

A first advantage of the metering device lies in the fact that the processing temperature for the coating process and thus the viscosity of the coating liquid, especially printing ink or a coating composition, can be adjusted and kept constant during the coating process. By the same token, the rheological properties of the coating liquids employed in the coating process can be influenced. The method as well as the metering device can be used for different printing or coating methods that apply a flowable coating liquid onto the printing substrate.

A second advantage results from the fact that selecting the processing temperature improves the quality of the coating on the printing substrate. For instance, when a coating composition is used as the coating liquid, the gloss grade can be improved and uniformly high quality can be attained on the printing substrate or on the printed or coated image. For example, when printing ink is used as the coating liquid, the thickness of the layer formed on the printing substrate can be more uniform and a higher color brilliance can be obtained.

As a third advantage, it can be mentioned that the consumption of coating liquid can be reduced. The process-stable viscosity as well as the process-stable processing temperature account for more uniform layer thicknesses on the printing substrate, preferably within the range from about 2 μm to 5 μm.

A fourth advantage that deserves mention is that the work method or the device make it possible to save a considerable amount of time from the start-up until the selected target temperature of the coating liquid is reached (set-up time). This is particularly relevant for relatively small printing runs and the more frequent job changes and/or varying coating or cleaning media that are associated with these.

When a pilot control mode or an auxiliary regulation mode is employed, a further reduction of the set-up time as well as a reduction of the fluctuation range of the temperature of the coating liquid can also be achieved, especially in an area formed by a circulation system installed downstream from the temperature-regulation unit in the conveying direction of the coating liquid, and by the coating nip. In this context, it is advantageous that the reduced fluctuation range of the temperature ensures the quality of the coating liquid in a process-stable manner.

For example, overheating of the coating composition as the coating liquid can be avoided. At the end of the pilot control mode or of the auxiliary regulation mode, the coating liquid has approximately the target temperature (first target value of the temperature). Furthermore, a favorable start-up of the temperature-regulation unit can be achieved from the standpoint of energy costs since, after it has reached the preferably maximum temperature-regulation output, the target temperature of the coating liquid (first target value of the temperature) only has to be maintained, that is to say, regulated, by a low temperature-regulation input.

BRIEF DESCRIPTION OF THE DRAWINGS

The present invention will be described in greater detail below with reference to an embodiment. The following is shown in schematic form.

DETAILED DESCRIPTION

A printing machine or alternatively, a coating machine, has, among other things, a coating device for metering a coating liquid, especially printing ink or a coating composition, for a printing substrate.

Figure 1:
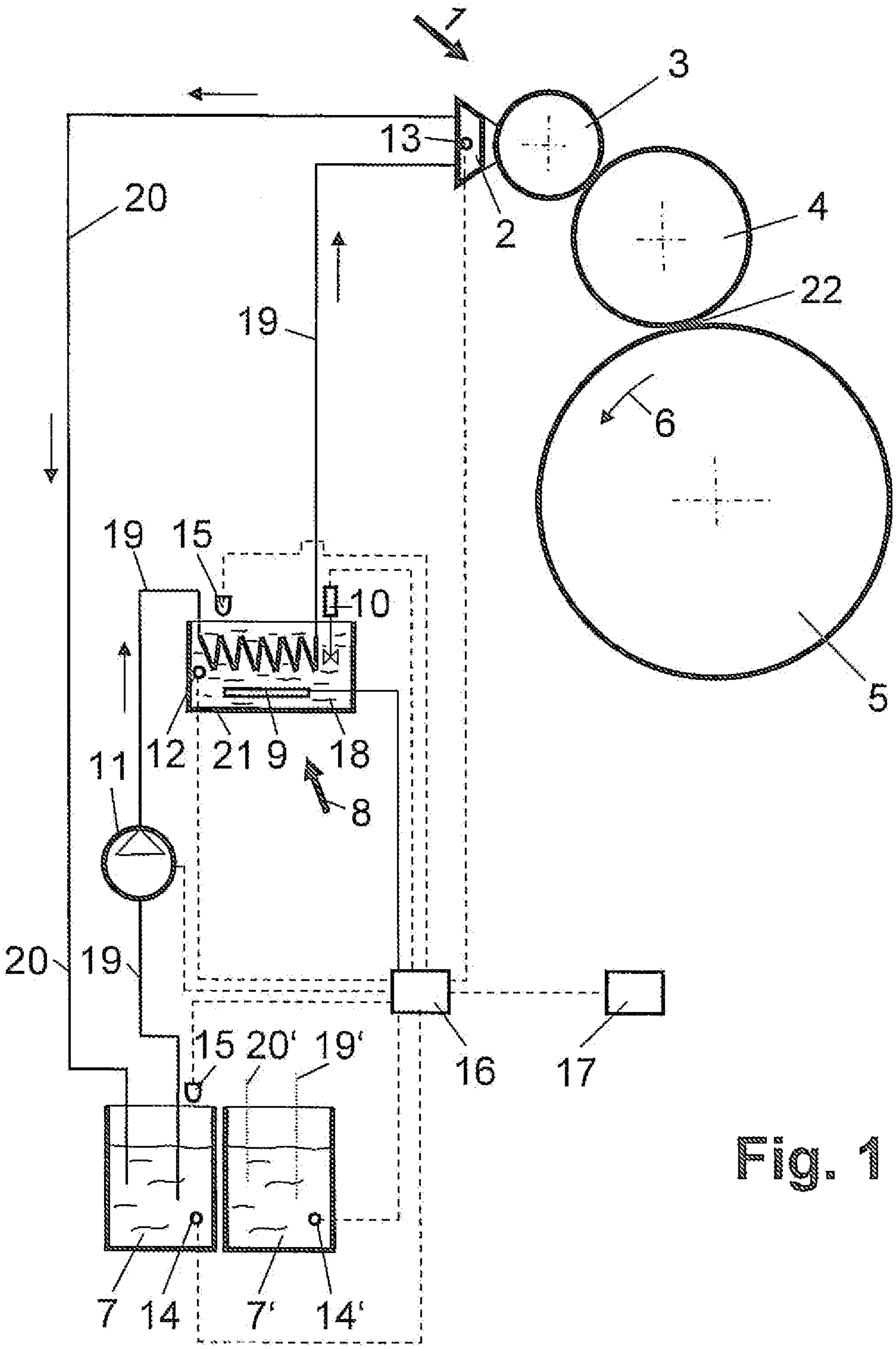
FIG. 1—a first device for coating, with a circulation system.

For example, the coating device according to FIG. 1 comprises a metering device 1 having an applicator roller 3, a plate cylinder 4 that is associated with the applicator roller 3 as well as a counter-pressure cylinder 5 that is associated therewith and that guides the printing substrate in the conveying direction 6. The applicator roller 3, the plate cylinder 4 as well as the counter-pressure cylinder 5 are arranged so that they can be brought into contact with each other, whereby the plate cylinder 4 and the counter-pressure cylinder 5 form a coating nip 22.

Figure 2:
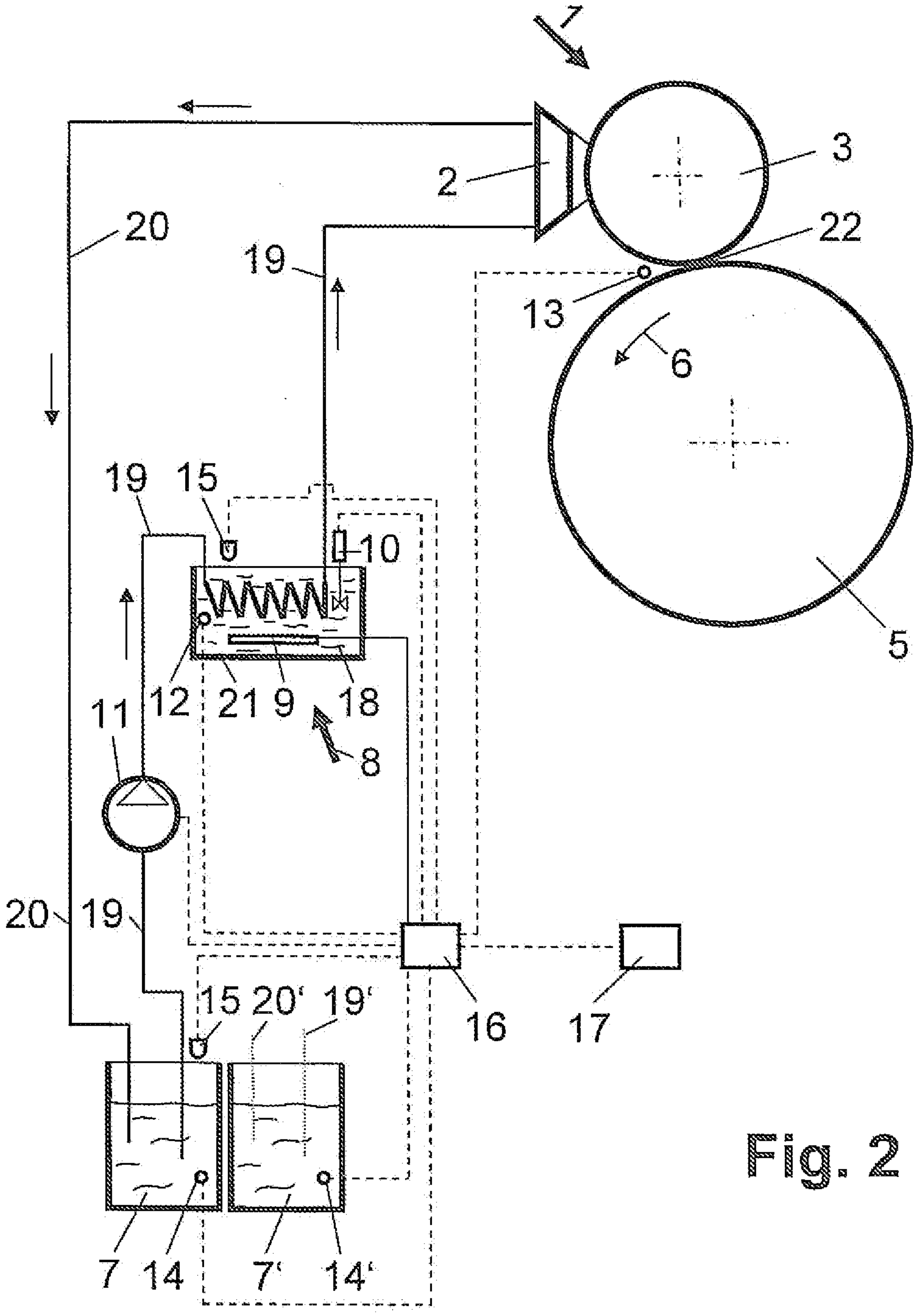
FIG. 2—a second device for coating, with a circulation system.

For instance, the coating device according to FIG. 2 comprises a metering device 1 having an applicator roller 3 and a counter-pressure cylinder 5 that is associated with the applicator roller 3 and that guides the printing substrate in the conveying direction 6. The applicator roller 3 can be provided with a print motif and is arranged so that it can be brought into contact with the counter-pressure cylinder 5. Thus, the applicator roller 3 and the counter-pressure cylinder 5 form the coating nip 22.

Figure 3:
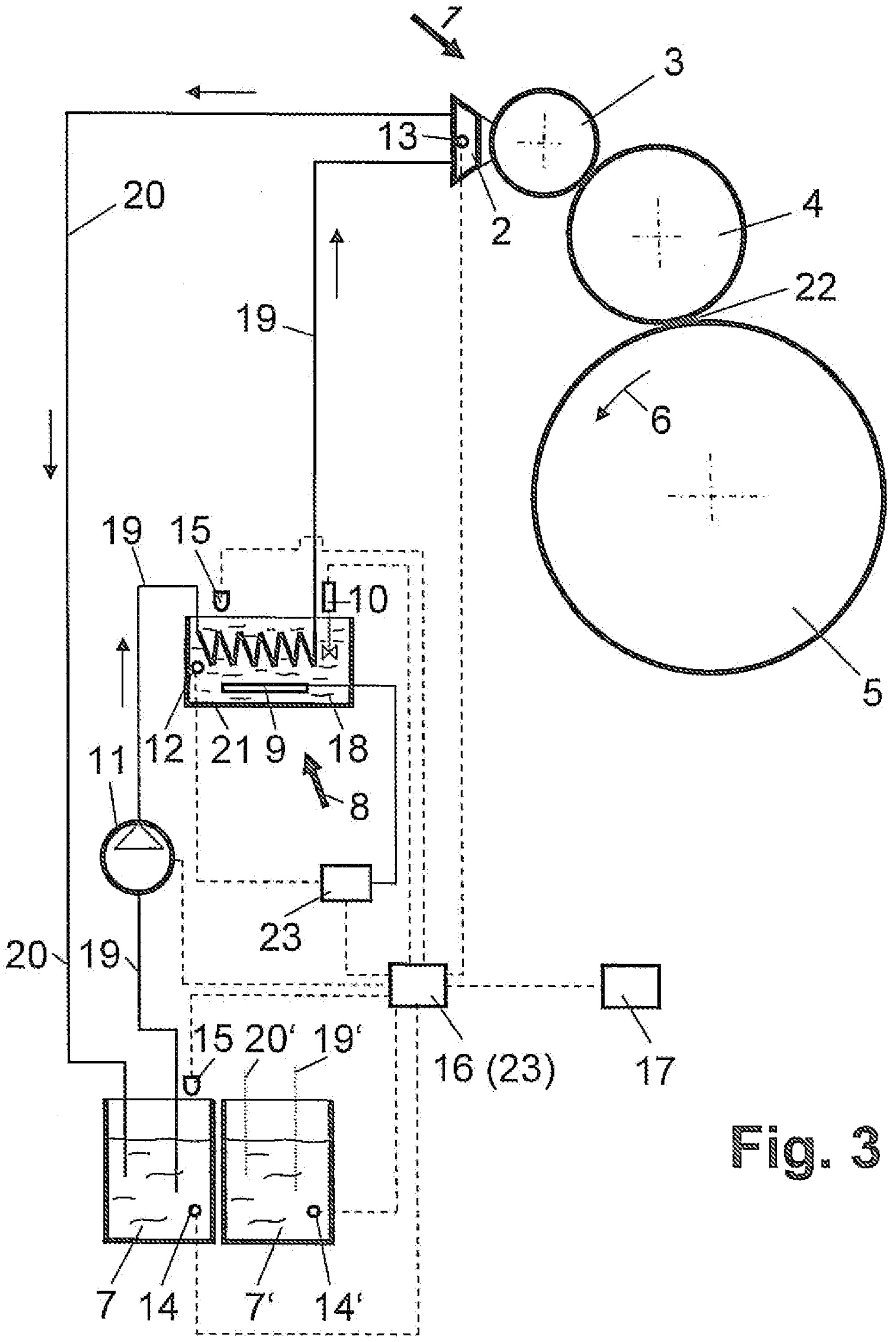
FIG. 3—a refinement of FIG. 1 or 2.

According to FIGS. 1 to 3, the metering device 1 has a chambered doctor blade 2 that is operatively connected to the applicator roller 3 that is configured, for example, as an anilox roller. Alternatively, the metering device 1 can comprise a familiar roller system, for instance, according to the squeeze roller or fountain roller principle. When a plate cylinder 4 is used, it can support a printing plate, including a flexographic printing plate, a coating plate or a rubber blanket (over the entire surface or with cutouts).

In order to circulate the coating liquid, the metering device 1 is coupled to a circulation system. Preferably, the circulation system comprises a supply line 19 and a return line 20, including a reservoir 7 for the coating fluid, as well as an integrated conveying pump 11. In the present embodiment, the supply line 19 opens into the housing of the chambered doctor blade 2. From the housing of the chambered doctor blade 2, the return line 20 leads into the reservoir 7. The coating liquid can be conveyed into the reservoir 7 via the return line 20 using the principle of gravity. A conveying pump 11 integrated into the supply line 19 causes the coating liquid to circulate. If needed, it is possible, although not absolutely necessary, to integrate a suction pump into the return line 20.

In the conveying direction of the coating liquid, a temperature-regulation unit 8 is preferably arranged downstream from the conveying pump 11 of the supply line 19. The temperature-regulation unit 8 comprises at least one temperature regulator 9. Preferably, the temperature-regulation unit 8 comprises at least the temperature regulator 9 and a temperature-regulation medium 18. In the present example, the temperature-regulation unit 8 comprises a temperature-regulation medium 18 and a container 21 that accommodates a preferably coiled portion of the supply line 19 as well as the temperature regulator 9 that acts upon the temperature-regulation medium 18 and that is configured as a heating/cooling device.

In order to improve the thorough mixing of the temperature-regulation medium 18 in the container 21, the temperature-regulation unit 8 can have a mixing apparatus 10, if necessary. For example, the mixing apparatus 10 can be configured as an agitator 10 that is immersed into the container 21. The mixing apparatus 10 can be actuated manually or by means of a main regulation device 16. Therefore, the temperature-regulation medium is thoroughly mixed in those cases where the temperature-regulation unit 8 has a temperature-regulation medium.

For purposes of monitoring the level of the temperature-regulation medium 18, the container 21 can have a filling level sensor 15, if necessary. Such a filling level sensor 15 can also be installed in the reservoir 7, if necessary.

The temperature-regulation unit 8 also comprises a first temperature sensor 12 to determine the temperatures in the unit while the coating liquid is being circulated or transferred. Depending on the design of the temperature-regulation unit 8, the first temperature sensor 12 is preferably arranged in the temperature-regulation unit 8, for example, it is integrated into the container 21.

Furthermore, in an area formed by the supply line 19 located downstream from the temperature-regulation unit 8 in the conveying direction of the coating liquid, and by the coating nip 22, the device comprises a second temperature sensor 13.

In this context, the conveying pump 11, the temperature sensors 12, 13 and the temperature regulator 9 are connected in terms of the circuitry and the data to a main regulation device 16 in such a manner that either the temperature regulator 9 or the conveying pump 11 can be activated, as desired.

In a refinement, the temperature regulator 9 and the conveying pump 11 can be configured so that they can be activated simultaneously by means of the main regulation device 16. In another embodiment, in an area formed by the reservoir 7 and by the supply line 19 located upstream from the temperature-regulation unit 8 in the conveying direction of the coating liquid—starting from the reservoir 7—there can be a third temperature sensor 14 that is connected in terms of the circuitry and the data to the main regulation device 16. Preferably, the third temperature sensor 14 is arranged in the reservoir 7. As an alternative, this temperature sensor 14 can be associated with or integrated into the supply line 19 in the area between the reservoir 7 and the temperature-regulation unit 8, or else be arranged in the conveying pump 11.

In a refinement, an auxiliary regulation device 23 is connected in terms of the circuitry and the data to the superordinated main regulation device 16. Here, the temperature regulator 9 and the first temperature sensor 12 of the temperature-regulation unit 8 are coupled in terms of the circuitry and the data to the auxiliary regulation device 23. Alternatively, the auxiliary regulation device 23 is integrated in terms of the circuitry and the data into the main regulation device 16.

According to FIGS. 1 and 3, the second temperature sensor 13 is arranged, for example, inside the chambered doctor blade 2. As an alternative, this second temperature sensor 13 can be associated with the roller shell of the applicator roller 3. In roller systems, the temperature sensor 13 can be associated with a roller shell or with a roller nip or with a container (with an immersing fountain roller) that holds the coating liquid. Summarizing, the second temperature sensor 13 can be arranged in the area of the metering device 1.

According to FIG. 2, the second temperature sensor 13 is arranged, for instance, downstream from the coating nip 22 in the conveying direction 6. Alternatively, the second temperature sensor 13 can also be arranged upstream from the coating nip 22 in the conveying direction 6. The second temperature sensor 13 can be arranged so as to be facing the plate cylinder 4 (in the embodiment according to FIG. 1) or facing the applicator roller 3 or facing the printing substrate (on the counter-pressure cylinder 5) for purposes of detecting the temperature values of the coating liquid.

All of the temperature sensors 12 to 14, the filling level sensors 15, the mixing apparatus 10, the temperature regulator 9 as well as the conveying pump 11 are connected in terms of the circuitry and the data to the main regulation device 16. The main regulation device 16 is preferably coupled in terms of the circuitry and the data by means of an interface 17, for instance, to a superordinated machine control system or to an order-data processing device of a processing machine. As an alternative, the main regulation device 16 or the interface 17 can be coupled to a manually operated panel. Data, preferably order data, data pertaining to the coating liquids, data on the pre-settings, etc., can all be entered or read in via the interface 17.

The working method is as follows: on the main regulation device 16, a pre-selection is made of a first target value for the temperature of the coating liquid in an area formed by the circulation system (supply line 19 between the temperature-regulation unit 8 and the metering system 1) located downstream from the temperature-regulation unit 8 in the conveying direction of the coating liquid, and by the coating nip 22. The conveying pump 11 is started and the coating liquid is conveyed in the direction of the coating nip 22.

Subsequently or concurrently, a first actual value for the temperature of the temperature-regulation unit 8 is detected by means of the sensor 12 in the temperature-regulation unit 8, while a second actual value for the temperature of the coating liquid is detected by means of the sensor 13 in the area formed by the circulation system located downstream from the temperature-regulation unit 8 and by the coating nip 22, and at least one signal is transmitted to the main regulation device 16 in each case.

Subsequently, the second actual value of the temperature undergoes a comparison of the target value to the actual value by the main regulation device 16 and, as a function of the first detected actual value of the temperature, the main regulation device 16 then sends at least one control signal

- to a temperature regulator 9 of the temperature-regulation unit 8 and the temperature of the coating liquid is regulated (heated or cooled) by means of the temperature regulator 9, or
- to the conveying pump 11 and the volume flow of the coating liquid is changed by means of the conveying pump 11.

In another embodiment, the main regulation device 16 can send a control signal to the temperature regulator 9 and to the conveying pump 11, and the temperature regulator 9 and the conveying pump 11 are activated at the same time.

In another embodiment, the temperature regulator 9 can be activated at a constant volume flow of the coating liquid.

In another embodiment, the volume flow of the coating liquid can be changed while the temperature of the temperature regulator 9 remains constant.

In a refinement, the temperature regulator 9 can be temporarily activated in a pilot control mode after the first target value of the temperature has been pre-selected on the main regulation device 16 and before the conveying pump 11 has been started, as a function of a third actual value for the temperature of the coating liquid that has been detected by means of the sensor 14 in an area formed by the reservoir 7 and by the circulation system arranged upstream from the temperature-regulation unit 8 in the conveying direction of the coating liquid.

In a refinement, the temperature regulator 9 can be temporarily activated in a pilot control mode before the first target value of the temperature has been pre-selected on the main regulation device 16 and before the conveying pump 11 has been started, as a function of a second target value of the temperature stored in the main regulation device 16 and as a function of a third actual value for the temperature of the coating liquid that has been detected by means of the sensor 14 in an area formed by the reservoir 7 and by the circulation system arranged upstream from the temperature-regulation unit 8 in the conveying direction of the coating liquid. In this context, the temperature regulator 9 can be operated in the specific pilot control mode at the maximum temperature-regulation output, that is to say, the cooling or heating output.

In another embodiment, either the temperature regulator 9 or the conveying pump 11 can be activated periodically. By the same token, the temperature regulator 9 and the conveying pump 11 can be activated periodically at the same time.

In another embodiment, after the first target value of the temperature or the second target value of the temperature has been pre-selected at the main regulator device 16 in the pilot control mode, the activation of the conveying pump 11 can be temporarily delayed as a function of the third actual value for the temperature of the coating liquid detected by means of the sensor 14.

In a refinement, after the conveying pump 11 has been started, the main regulation device 16, in a regulation mode (auxiliary regulation mode), can periodically specify to an auxiliary regulation device 23 an auxiliary target value calculated on the basis of the second actual value of the temperature (detected by means of the second temperature sensor 13), and a first actual value of the temperature detected by means of sensor 12 can be sent to the auxiliary regulation device 23 by means of the temperature-regulation unit 8, so that the auxiliary regulation device 23 compares the auxiliary target value to the actual value of the temperature detected by means of the sensor 12 and subsequently activates or deactivates the temperature regulator 9.

The mode of operation of the device is as follows: the temperature-regulation unit 8 associated with the supply line 19, especially its temperature regulator 9 as well as the temperature-regulation medium 18, acts upon the coating liquid in the supply line 19. The temperature-regulation unit 8 comprises the first temperature sensor 12, which detects the first actual value for the temperature of the coating liquid in the temperature-regulation unit 8 and transmits this value to the main regulation device 16. The second temperature sensor 13, which is preferably arranged in the area of the metering device 1, detects the second actual value for the temperature of the coating liquid and transmits this value to the main regulation device 16. After a target value for the temperature of the coating liquid has been pre-selected on the main regulation device 16 at the beginning, the main regulation device 16 performs a comparison of the target value to the actual value and preferably activates the machine control system, preferably via the interface 17, in such a way that a selection can be made between activating either the temperature regulator 9 or the conveying pump 11.

In another embodiment, the temperature regulator 9 and the conveying pump 11 can be jointly activated by means of the main regulation device 16.

Another reservoir 7' can be provided in order for a second coating liquid or cleaning liquid to be used. Here, only the supply line 19 and the return line 20 and, if necessary, the third temperature sensor 14 should be removed from the reservoir 7 and installed in the reservoir 7' as the supply line 19', the return line 20' and the temperature sensor 14', respectively.

What is claimed is:

1. A method for metering a coating liquid in a processing machine having a metering device including at least one applicator roller and one counter-pressure cylinder that forms a coating nip and that guides the printing substrate, the metering device being operatively connected to a circulation system for circulating the coating liquid including a supply line, a temperature-regulation unit disposed in the supply line, a return line, a reservoir and a conveying pump, the method comprising:

pre-selecting, on a main regulation device, a first target temperature value for the coating liquid in a first area defined by the circulation system downstream of the temperature-regulation unit and between the supply line and the coating nip;

conveying the coating liquid using the conveying pump in a direction of the coating nip through the temperature regulation unit, the temperature regulation unit including a container accommodating a temperature regulator and a temperature-regulation medium within the container, wherein the temperature regulation medium is a fluid other than the coating liquid;

detecting a first actual temperature value at the temperature-regulation unit using a first sensor disposed in the temperature regulation unit;

detecting a second actual temperature value of the coating liquid in the first area using a second sensor;

transmitting at least one signal to the main regulation device for each of the first and second temperature values detected;

comparing the second actual temperature value to the first target temperature value using the main regulation device; and sending at least one control signal from the main regulation device as a function of the first actual temperature value and based on the comparison of the second actual temperature value to the first target temperature value so as to activate at least one of the temperature regulator of the temperature-regulation unit to regulate the temperature of coating liquid in the temperature regulation unit and the conveying pump to regulate the volume flow of the coating liquid.

2. The method as recited in claim 1, wherein the at least one control signal is sent to a temperature regulator of the temperature-regulation unit and further comprising the step of regulating the temperature of the coating liquid using the temperature regulator.

3. The method as recited in claim 2, wherein the temperature regulator is activated at a constant volume flow of the coating liquid.

4. The method as recited in claim 1, wherein the at least one control signal is sent to the conveying pump and further comprising the step of changing a volume flow of the coating liquid using the conveying pump.

5. The method as recited in claim 4, wherein the volume flow of the coating liquid is changed at a constant temperature of the temperature regulator.

6. The method as recited in claim 1, where in the metering device includes a plate cylinder disposed between the applicator roller and the counter-pressure cylinder and wherein the coating nip is formed between the counter-pressure cylinder and the plate cylinder.

7. The method as recited in claim 1, wherein the at least one control unit is sent from the main regulation device to the temperature regulator and the conveying pump, and wherein the temperature regulator and the conveying pump are activated at the same time.

8. The method as recited in claim 1, further comprising detecting a third actual temperature value of the coating liquid in a third area defined by the circulation system upstream from the temperature regulation unit, temporarily activating the temperature regulator in a pilot control mode as a function of the third actual temperature value after the pre-selecting of the first target temperature value and before the conveying of the coating liquid using the conveying pump.

9. The method as recited in claim 8, wherein the temperature regulator is operated in the pilot control mode at a maximum temperature-regulation output.

10. The method as recited in claim 9, wherein either the temperature regulator or the conveying pump is activated periodically.

11. The method as recited in claim 9, wherein the temperature regulator and the conveying pump are activated periodically at the same time.

12. The method as recited in claim 1, further comprising detecting a third actual temperature value of the coating liquid in a third area defined by the circulation system upstream from the temperature regulation unit, temporarily activating the temperature regulator in a pilot control mode as a function of a second target temperature value stored in the main regulation device and as a function of the third actual temperature value after the pre-selecting of the first target temperature value and before the conveying of the coating liquid using the conveying pump.

13. The method as recited in claim 1, further comprising preselecting a second target temperature value at the main regulator device in a pilot control mode, and, after the pre-selecting of the first temperature value or the preselecting of the second temperature value, temporarily delaying an activation of the conveying pump as a function of the third actual temperature value of the coating liquid in a third area defined by the circulation system upstream from the temperature regulation unit.

14. The method as recited in claim 1, further comprising, after the conveying of the coating liquid, periodically specifying an auxiliary target temperature value calculated based on the second actual temperature value to an auxiliary regulation device using the main regulation device in a regulation mode, sending the first actual temperature value to the auxiliary regulation device using the temperature regulation unit, comparing the auxiliary target temperature value to the first actual temperature value using the auxiliary regulation device, and activating or deactivating the temperature regulator using the auxiliary regulation device.

15. The method as recited in claim 1, wherein the temperature-regulation unit includes a temperature-regulation medium and wherein the temperature-regulation medium is thoroughly mixed.

* * * * *